United States Patent
Mizuno et al.

[11] Patent Number: 5,925,892
[45] Date of Patent: Jul. 20, 1999

[54] JOSEPHSON JUNCTION ELEMENT WITH AN ASYMMETRIC GROOVE PROVIDING A SINGLE WEAK LINK REGION

[75] Inventors: Yuji Mizuno, Kashiwa; Katsumi Suzuki, Kodaira; Youichi Enomoto, Tokyo, all of Japan

[73] Assignees: International Superconductivity Technology Center; Sharp Kabushiki Kaisha; NEC Corporation, all of, Japan

[21] Appl. No.: 08/873,865

[22] Filed: Jun. 12, 1997

[30] Foreign Application Priority Data

Jun. 14, 1996 [JP] Japan ................................. 8-153832

[51] Int. Cl.⁶ ....................... H01L 29/06; H01L 31/0256; H01L 39/22
[52] U.S. Cl. ................................. 257/34; 257/31; 257/33; 505/239
[58] Field of Search ................................ 257/31, 32, 33, 257/34, 35; 505/239

[56] References Cited

U.S. PATENT DOCUMENTS 5,196,395  3/1993  James et al. ............................. 257/31
5,498,881  3/1996  Fujimoto et al. ........................ 257/34

FOREIGN PATENT DOCUMENTS 341148   11/1989  European Pat. Off. ................. 257/33
4109765  10/1992  Germany ................................ 257/31

Primary Examiner—Mahshid Saadat
Assistant Examiner—Allan R. Wilson
Attorney, Agent, or Firm—Lorusso & Loud

[57] ABSTRACT

A Josephson junction element having a substrate of a single crystal having a V-shaped notch formed in a surface of the substrate and a wiring pattern of an oxide superconductor formed on the surface of the substrate and crossing the notch to form a weak link region in the pattern at a position above the notch. The notch is defined by first and second walls joining with each other at the bottom of the notch and has first and second corners at which the first and second walls meet the surface of the substrate. The first and second corners have radii of curvature of 5–50 nm and 50–500 nm, respectively, provided that the difference in radius of curvature between the first and second corners is not smaller than 10 nm. The notch is formed by obliquely irradiating a predetermined portion of the substrate with a focused ion beam.

6 Claims, 4 Drawing Sheets

JOSEPHSON JUNCTION ELEMENT WITH AN ASYMMETRIC GROOVE PROVIDING A SINGLE WEAK LINK REGION

BACKGROUND OF THE INVENTION

This invention relates to a Josephson junction element and to a process for the production thereof.

U.S. Pat. No. 5,534,715 discloses a method of manufacturing YBCO Josephson junctions using a focused Ga ion-beam to damage a substrate before deposition of a YBCO film. The ion-beam irradiation causes implantation of Ga ions into the substrate so that an altered region is formed in the YBCO film at a position just above the irradiated region. As a result, there is formed a SNS structure. This method has a problem in reproducibility. Namely, the superconducting characteristics such as critical current density of the Josephson junction elements vary with elements to elements.

A method is also known which comprises the steps of: irradiating a predetermined portion of a surface of a substrate of a MgO single crystal with a Ga focused ion beam to form a steep slope trench with symmetrical walls in the substrate, depositing YBaCuO superconductor on the surface of the substrate so that a weak link is formed in the YBaCuO layer, and patterning the YBaCuO superconductor layer to form a wiring pattern such that the weak link intersects the wiring pattern. In this method, a superconductor/normal metal/superconductor (SNS) structure is considered to be formed because the crystal orientation of the superconductor in the trench differs from that of the superconductor outside of the trench or because a grain boundary is formed on the trench. With this method, however, the reproducibility of the Josephson junction characteristics is not good.

SUMMARY OF THE INVENTION

It is, therefore, an object of the present invention to provide a process of defining a Josephson junction on any desired area on a substrate with good reproducibility in superconducting properties such as critical current density.

Another object of the present invention is to provide a Josephson junction suitable for the formation of an integrated circuit.

In accordance with one aspect of the present invention there is provided a Josephson junction element comprising a substrate of a single crystal having a substantially flat surface, a V-shaped notch formed in said flat surface and including first and second walls joining with each other to form the bottom of said notch, said notch having first and second corners at which said first and second walls meet said flat surface, respectively, and a wiring pattern of an oxide superconductor formed on said flat surface of said substrate and crossing said notch to form a weak link region in said pattern at a position above said notch, said first and second corners having radii of curvature of 5–50 nm and 50–500 nm, respectively, provided that the difference in radius of curvature between the first and second corners is not smaller than 10 nm.

In another aspect, the present invention provides a process for the production of a Josephson junction, comprising the steps of:

(a) obliquely irradiating a predetermined portion of a flat surface of a substrate of a single crystal with a focused ion beam so that a V-shaped notch including first and second walls joining with each other to form the bottom of said notch is formed in said irradiated surface of said substrate, said notch having first and second corners at which said first and second walls meet said flat surface, respectively, said first and second corners having radii of curvature of 5–50 nm and 50–500 nm, respectively, provided that the difference in radius of curvature between the first and second corners is not smaller than 10 nm; and (b) forming a wiring pattern of an oxide superconductor on said flat surface of said substrate such that said wiring pattern crosses said notch, thereby forming a weak link region in said pattern at a position above said notch.

It has been found that the bad reproducibility of the known Josephson junction element with a V-shaped or U-shaped steep trench with symmetrical walls is attributed to the formation of two or three junctions in one trench, i.e. at two corner edges and at the bottom of the trench. In the present invention, there is formed only one junction at the corner edge having a radius of curvature of 5–50 nm and, therefore, the reproducibility in critical current density is improved.

BRIEF DESCRIPTION OF THE DRAWINGS

Other objects, features and advantages of the present invention will become apparent from the detailed description of the preferred embodiments of the invention which follows, when considered in light of the accompanying drawings, in which.

DETAILED DESCRIPTION OF THE PREFERRED EMBODIMENTS OF THE INVENTION

Figure 2:
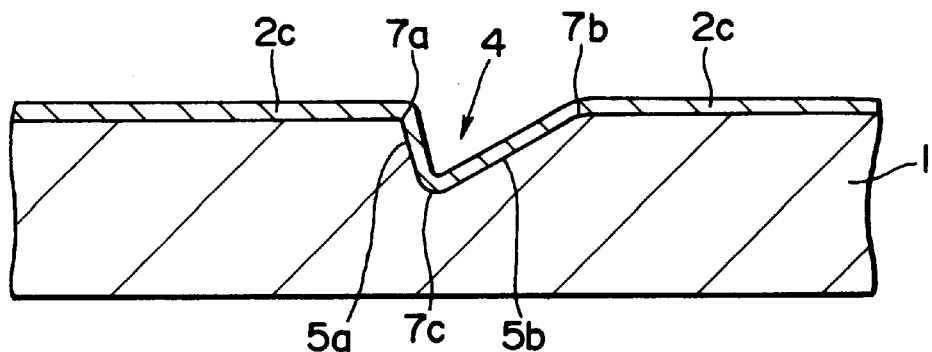
FIG. 2 is an enlarged cross-sectional view taken on line II—II in FIG. 1.

Referring first to FIG. 2, a Josephson junction element according to the present invention includes a substrate 1 of a single crystal having a substantially flat surface. The single crystal may be, for example, MgO, $SrTiO_3$, $NdGaO_3$, $LaAlO_3$ or $LaGaO_3$. If desired a mixed crystal of one or more of these single crystals may be used. It is important that the substrate 1 have a substantially flat surface. The term "substantially flat surface" used herein is intended to refer to such a surface that a superconductive layer provided thereon has crystal orientation substantially equal throughout that surface. Thus, the presence of small grooves or steps in a surface of the substrate 1 is permissive for the purpose of the present invention as long as the crystal orientation of a superconductor layer provided on that surface is substantially the same.

The substrate 1 has a V-shaped notch 4 having first and second walls 5a and 5b joining with each other at their lower end to form a bottom 7c of the notch 4. The notch 4 has first and second corners 7a and 7b at which the first and second walls 5a and 5b meet said flat surface of the substrate, respectively. It is important that one of the first and second corners 7a and 7b (the corner 7b in the illustrated case) should have a radius of curvature of 50–500 nm and the other corner (the corner 7a in the illustrated case) in the illustrated case has a radius of curvature of 5–50 nm, provided that the difference in radius of curvature between the first and second corners is not smaller than 10 nm, preferably not smaller than 30 nm. Preferably, the first and second corners 7a and 7b have radii of curvature of 5–30 nm and 60–500 nm, respectively. It is also preferred that the bottom 7c of the notch 4 have a radius of curvature of 50 nm or more. Thus, the notch 4 is not symmetrical but the lengths of the first and second walls 5a and 5b differ from each other.

Figure 1:
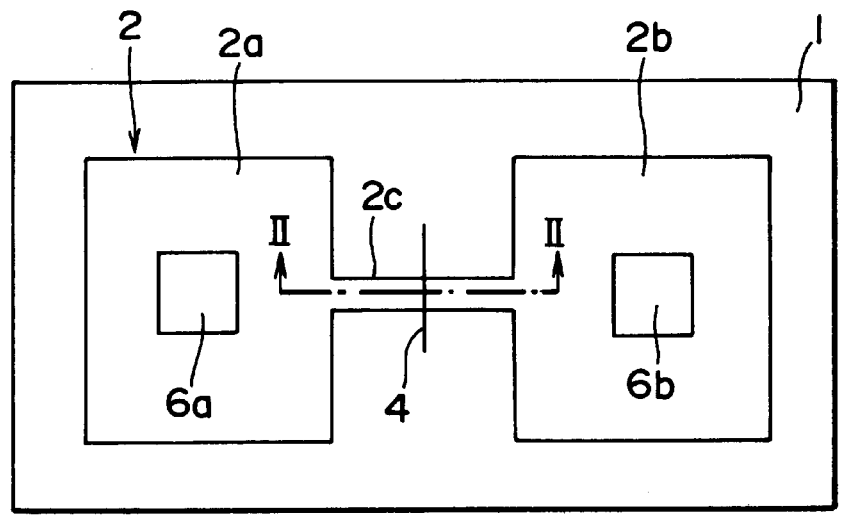
FIG. 1 is a plan view diagrammatically showing a Josephson junction according to the present invention.

As shown in FIG. 1, a wiring pattern 2 of an oxide superconductor composed of two large area sections 2a and 2b and a narrow bridging portion 2c extending therebetween is formed on the flat surface of the substrate 1 such that the narrow portion 2c crosses the notch 4 thereby to form a weak link region in the pattern 2 at a position above the notch 4. The superconductor layer 2 is preferably a c-axis oriented metal oxide of $RnBa_2Cu_3O_{7-x}$ wherein Rn represents a rare earth element, preferably Nd or Y and x is a number between 0 and 0.5. Designated as 6 and 6' are electrodes formed on the large area sections 2a and 2b.

One preferred embodiment of the fabrication of a Josephson junction according to the present invention will now be described with reference to FIGS. 3(a)–3(d).

Figure 3A:
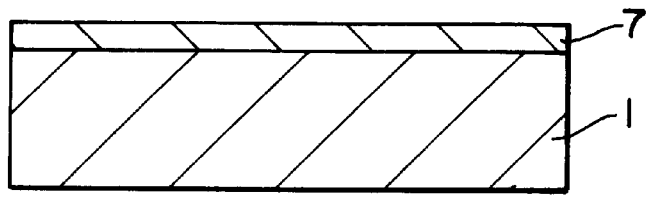
FIGS. 3(a)–3(d) are sectional views explanatory of process steps for the fabrication of the Josephson junction of FIG. 1.

As shown in FIG. 3(a), the substrate 1 is first coated with a normal metal, such as Au, Pd or Pt, to form a protecting layer 7 over the flat surface thereof. The formation of the protecting layer 7 may be suitably performed by vacuum deposition. The protecting layer 7 generally has a thickness of 3–300 nm, preferably 80–150 nm.

Figure 3B:
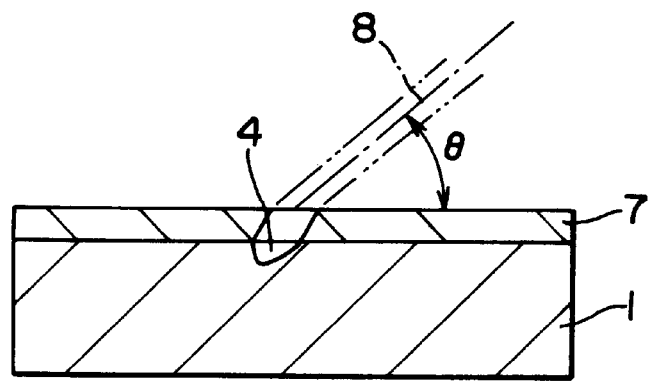

The coated substrate 1 is then irradiated with a focused ion beam 8 at any desired position so that the irradiated portion of the protecting layer 7 and the substrate 1 are etched and removed and a V-shaped notch 4 is defined in the substrate 1 at the desired position, as shown in FIG. 3(b). In this case, it is important that the substrate 1 should be obliquely irradiated with the focused ion beam 8 so that, as shown in FIG. 2, the corners 7a and 7b having radii of curvature of 5–50 nm and 50–500 nm, respectively can be formed. Preferably, the angle θ between the axis of the ion beam 8 and the flat surface of the substrate 1 is in the range of 10–50 degrees, more preferably 15–35 degrees. Since the focused ion beam has an intensity profile distributed in a Gaussian mode on the plane perpendicular to the axis of the ion beam, the irradiation in an oblique direction can form a V-shaped notch defined by a steep wall (wall 5a in FIG. 2) and a gradual wall (wall 5b in FIG. 2).

The focused ion beam is preferably $Ga^+$ ion beam. The beam diameter is preferably in the range of 10–100 nm and the beam current is in the range of 1 pA–60 nA. Because of the presence of the protecting layer 7, the formation of a large trench in the substrate 1 can be prevented.

Figure 3C:
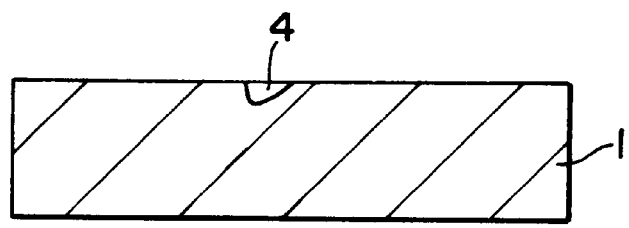

After the completion of the ion beam irradiation, the protecting layer 7 is completely removed from the substrate 1 as shown in FIG. 3(c). For this purpose, an argon ion milling method or a wet method using an aqueous solution containing KI and I is suitable for reasons of prevention of adverse affection on the substrate.

Figure 3D:
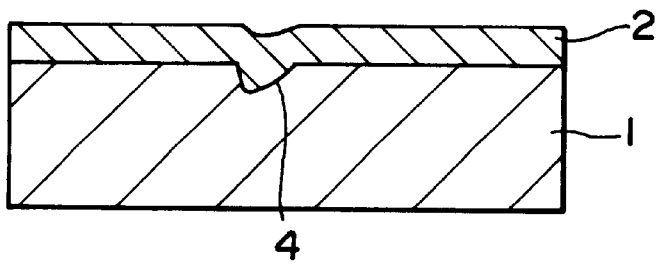

A layer 2 of an oxide superconductor is then formed on the surface of the substrate 1 from which the protecting layer 7 has been removed and which bears the V-shaped notch 4 (FIG. 3(d)). The thickness of the superconductor layer 2 is generally in the range of 0.05–0.6 μm, preferably 0.1–0.4 μm. The formation of the superconductor layer 2 may be performed by a high frequency sputtering method, a pulsed laser deposition method, a chemical vapor deposition method, a vacuum co-deposition method or any other suitable known method.

The superconductor layer 2 is thereafter patterned to define a wiring pattern 2a, 2b, 2c such that the V-shaped notch 4 intersects the wiring pattern 2c (FIG. 1), thereby forming a weak link region in the pattern at a position above the notch 4. Electrodes 6a and 6b are subsequently provided on the wiring pattern by any suitable known method. The patterning may be suitably effected by conventional photolithography.

In the foregoing embodiment, only one Josephson junction is formed on the substrate. This is, however, only for simplifying explanation. It is without saying that any desired number of such junctions can be formed on a single substrate in the same manner as above. The method according to the present invention is effective in producing integrated Josephson junctions utilized for the application to SQUIDS.

The following example will further illustrate the present invention.

EXAMPLE 1

One surface of a single crystal MgO substrate was coated with Au by DC (direct current) sputtering to form a protecting layer of Au having a thickness of about 120 nm. This was then disposed in a focused ion beam apparatus and was irradiated with focused $Ga^+$ ion beam accelerated at 30 KeV. The irradiation angle θ between the axis of the ion beam and the flat surface of the substrate (see FIG. 3(b)) was 30 degrees. The focused $Ga^+$ ion beam with a diameter of 50 nm was thus scanned through a length of 20 μm and a width of 150 nm with a beam current of 0.1 pA so that there was formed a V-shaped notch in the MgO substrate. The Au layer was then removed by 450 eV $Ar^+$ ion milling. The radii of curvature in the corners of the V-shaped notch were found to be 15 nm and 100 nm.

A $NdBa_2Cu_3O_{7-x}$ was then deposited on the substrate by a high frequency (rf) sputtering method to form a superconductor layer having a thickness of 300 nm. The formation of the superconductor layer was performed using $NdBa_2Cu_3O_{7-x}$ polycrystals as a target at a substrate temperature of 750° C., a discharging pressure of 80 mTorr, an oxygen gas flow rate of 1 sccm, an argon gas flow rate of 5 sccm, a high frequency power of 60 W and a growth period of 60 minutes.

The superconductor layer was then patterned to form an H-shaped wiring pattern which had a length of 30 μm and a width of 5 μm and which was intersected by the V-shaped notch. An electrode was applied to each of the four leg portions of the H-shaped wiring pattern to form a junction structure. When this structure was irradiated with a microwave, Shapiro steps were observed, indicating that the structure was a Josephson junction.

Figure 4:
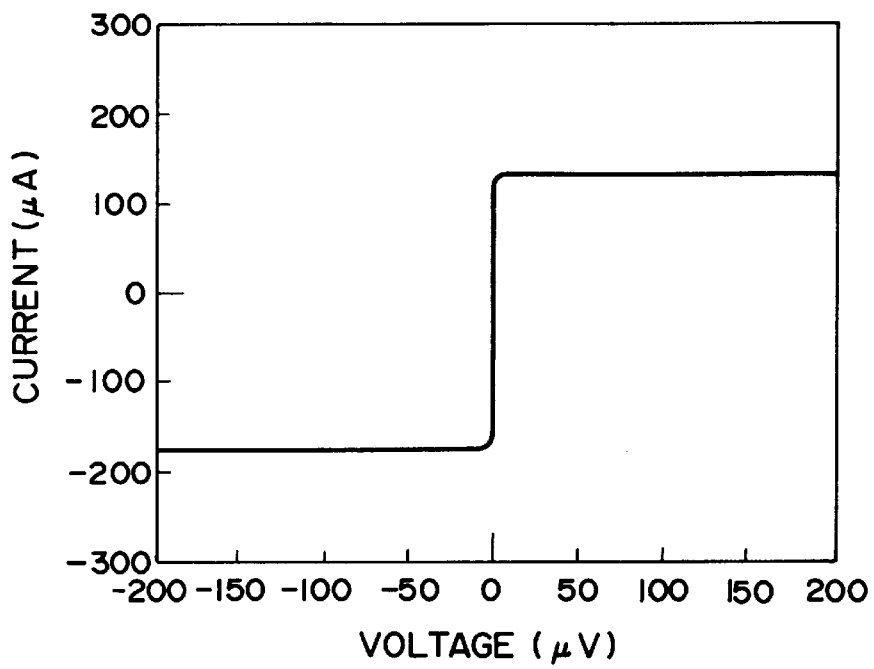
FIG. 4 is a graph showing current/voltage characteristics of the Josephson junction of this invention produced in Example 1.

FIG. 4 shows voltage-current characteristics of the above Josephson junction at 4.2 K, an electric current of 100 μA/div and a voltage of 50 μV/div. From FIG. 4, weak link characteristics are observed. The fact that no bent or curved portions are found suggests that only one Josephson junction was formed in the element.

Figure 5:
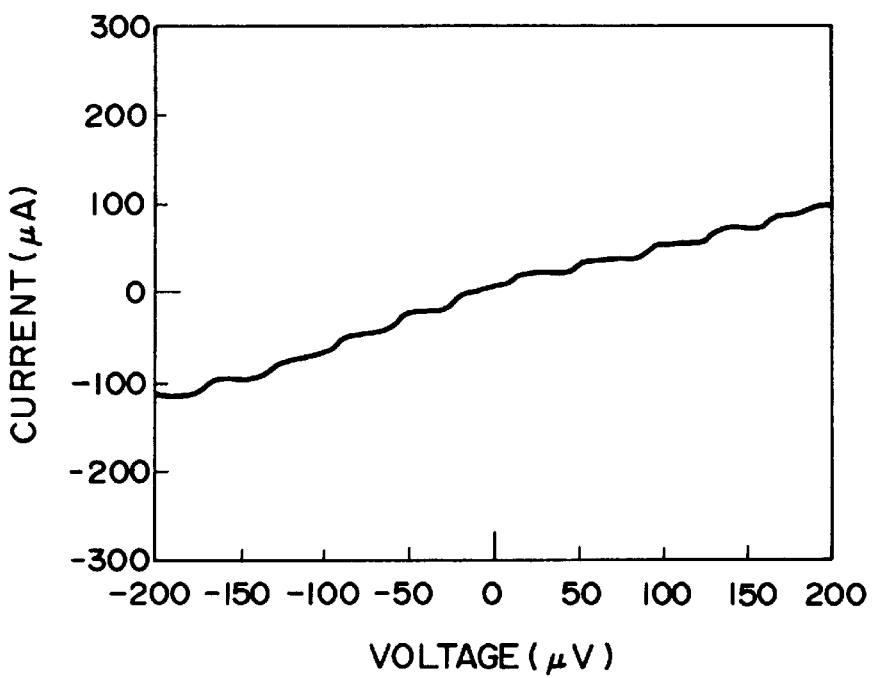
FIG. 5 is a diagram shown the Shapiro step characteristics of the Josephson junction produced in Example 1.

FIG. 5 shows Shapiro step characteristics of the above Josephson junction measured at 4.2 K, an electric current of 100 μA/div and a voltage of 50 μV/div while irradiating a strong microwave of 20 GHz. From the results shown in FIG. 5, it will be appreciated that the Josephson junction exhibits excellent performance.

EXAMPLE 2

Figure 6:
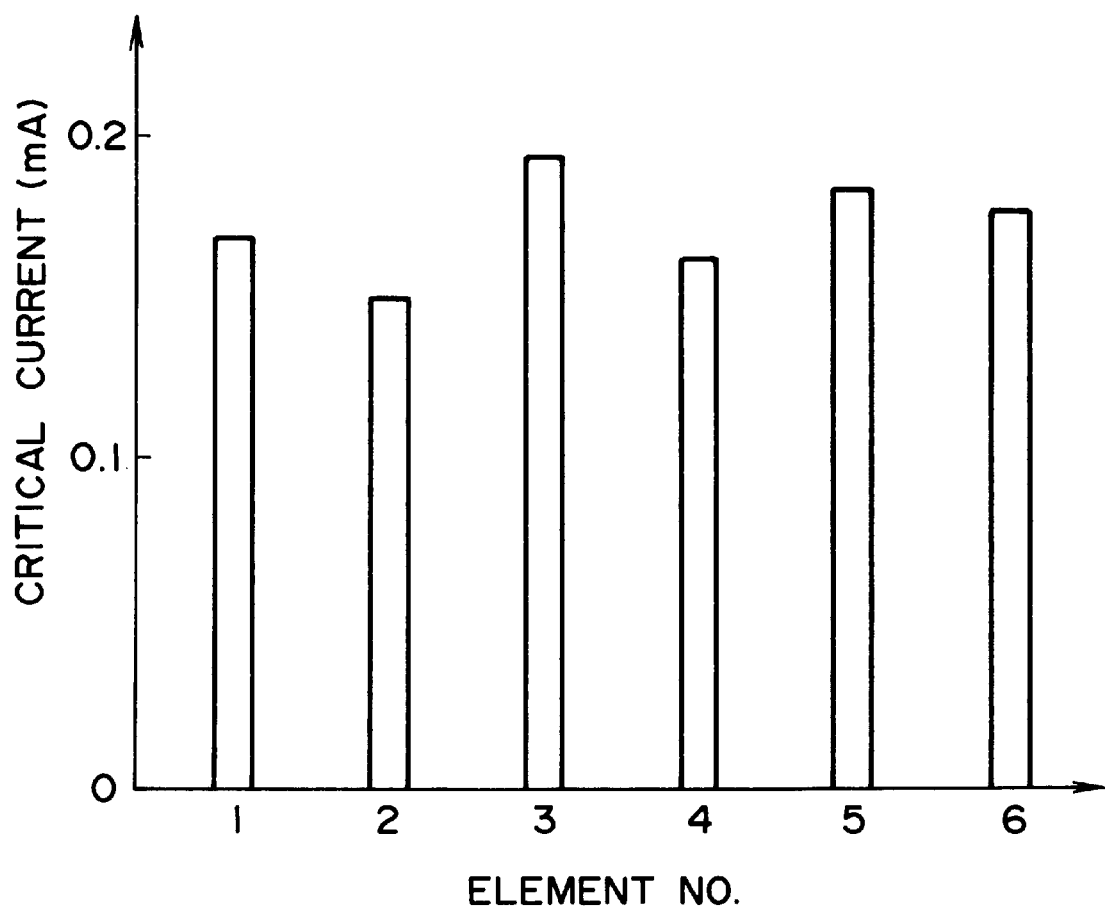
FIG. 6 shows superconducting critical electric current densities of six Josephson junctions prepared on the same substrate.

Six Josephson junction elements were prepared on the same MgO substrate in the same manner as that of Example 1. FIG. 6 shows a variation in critical current at 20 K of these elements. It will be appreciated that the variation is very small, namely the reproducibility is excellent.

EXAMPLE 3

Example 1 was repeated in the same manner as described except that the radiation angle θ between the axis of the ion beam and the flat surface of the substrate (see FIG. 3(*b*)) was 50 degrees. The Josephson junction element thus obtained showed a critical current density of about 10 times as great as that of Example 1 and was of a flux flow type.

EXAMPLE 4

Example 1 was repeated in the same manner as described except that the radiation angle θ between the axis of the ion beam and the flat surface of the substrate was 10 degrees. The Josephson junction element thus obtained was of a flux flow type.

EXAMPLE 5

Example 1 was repeated in the same manner as described except that the irradiation amount of the Ga$^+$ ion beam was reduced to a half. The Josephson junction element thus obtained was of a flux flow type. When the irradiation amount was doubled, on the other hand, no superconducting current was detected. The foregoing results indicate that the electric characteristics of Josephson junction elements according to the present invention can be controlled by irradiation conditions.

EXAMPLE 6

Example 1 was repeated in the same manner as described except that the superconductor film was formed by a pulsed laser method. The pulsed laser method was carried out using NdBa$_2$Cu$_3$O$_{7-x}$ polycrystals as a target at a substrate temperature of 790° C., an oxygen partial pressure of 100 mTorr and a growth period of 27 minutes. The laser was KrF eximer laser having a wave length of 248 nm and an energy density of 5 J/cm$^2$. The thus obtained Josephson junction element had current/voltage characteristics similar to that of Example 1.

EXAMPLE 7

Example 6 was repeated in the same manner as described except that YBa$_2$Cu$_3$O$_{7-x}$ polycrystals as a target at a substrate temperature of 740° C., an oxygen partial pressure of 200 mTorr and a growth period of 40 minutes. The thus obtained Josephson junction element having YBa$_2$Cu$_3$O$_{7-x}$ superconductor wiring pattern had current/voltage characteristics similar to that of Example 1.

EXAMPLE 8

Example 1 was repeated in the same manner as described except that the radiation angle θ between the axis of the ion beam and the flat surface of the substrate was changed so that the radii of curvature in the corners of the V-shaped notch were 50 nm and 60 nm. The Josephson junction element thus obtained was of a flux flow type.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A Josephson junction element comprising a substrate of a single crystal having a substantially flat surface, a V-shaped notch formed in said flat surface and including first and second walls joining with each other to form said notch, said notch having first and second corners at which said first and second walls meet said flat surface, respectively, said first wall meeting said flat surface at a substantially smaller angle than the angle between said second wall and said flat surface, and a wiring pattern of an oxide superconductor formed on said flat surface of said substrate and crossing said notch to form a single weak link region in said pattern in crossing said notch, said single weak link region being located at a position above said first corner.

2. A Josephson junction element according to claim 1, wherein said first and second corners have radii of curvature of 5–30 nm and 60–500 nm, respectively.

3. A Josephson junction element according to claim 1, wherein said oxide superconductor is c-axis oriented metal oxide of RnBa$_2$Cu$_3$O$_{7-x}$ wherein Rn represents a rare earth element and x is a number between 0 and 0.5.

4. A Josephson junction element according to claim 1, wherein said oxide superconductor is c-axis oriented metal oxide of NdBa$_2$Cu$_3$O$_{7-x}$ wherein x is a number between 0 and 0.5.

5. A Josephson junction element according to claim 1, wherein said oxide superconductor is c-axis oriented metal oxide of YBa$_2$Cu$_3$O$_{7-x}$ wherein x is a number between 0 and 0.5.

6. A Josephson junction element according to claim 1 wherein said first and second corners have radii of curvature of 5–50 nm and 50–500 nm, respectively, and wherein said radii of curvature differ from each other by at least 10 nm.

\* \* \* \* \*

UNITED STATES PATENT AND TRADEMARK OFFICE
CERTIFICATE OF CORRECTION

PATENT NO. : 5,925,892
DATED : July 20, 1999
INVENTOR(S) : MIZUNO et al

It is certified that error appears in the above-indentified patent and that said Letters Patent is hereby corrected as shown below:

ON THE FACE OF THE PATENT:

"[75] Inventors", line 3, "Tokyo" should read --Nerima--.

"[73] Assignees:, line 3, "all of," should read --all of--.

Signed and Sealed this

Eleventh Day of April, 2000

Q. TODD DICKINSON

Attest:

Attesting Officer

Director of Patents and Trademarks